United States Patent
Weinstein et al.

(10) Patent No.: US 12,005,389 B1
(45) Date of Patent: Jun. 11, 2024

(54) RETROFITTABLE DRY MEDIA ABATEMENT REACTOR

(71) Applicant: GlobalFoundries U.S. Inc., Malta, NY (US)

(72) Inventors: Justin Weinstein, Clifton Park, NY (US); Kimberly E. Konar, Stillwater, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/479,346

(22) Filed: Oct. 2, 2023

(51) Int. Cl.
| | |
|---|---|
| *B01D 53/04* | (2006.01) |
| *B01D 53/40* | (2006.01) |
| *B01D 53/82* | (2006.01) |
| *H01L 21/67* | (2006.01) |

(52) U.S. Cl.
CPC ..... *B01D 53/0446* (2013.01); *B01D 53/0423* (2013.01); *B01D 53/40* (2013.01); *B01D 53/82* (2013.01); *B01D 2253/102* (2013.01); *B01D 2258/0216* (2013.01); *B01D 2259/4145* (2013.01); *H01L 21/67017* (2013.01)

(58) Field of Classification Search
CPC ............ B01D 53/0446; B01D 53/0423; B01D 53/0454; B01D 53/40; B01D 53/82; B01D 2253/102; B01D 2258/0216; B01D 2259/4145; H01L 21/67017
USPC .......................................... 96/108, 121, 132
See application file for complete search history.

(56) References Cited

U.S. PATENT DOCUMENTS

| | | | |
|---|---|---|---|
| 6,238,467 B1 * | 5/2001 | Azarian | B01D 46/10 96/135 |
| 7,323,042 B1 | 1/2008 | Sherer | |
| 7,736,600 B2 | 6/2010 | Clark et al. | |
| 2005/0061147 A1 | 3/2005 | Marganski et al. | |
| 2005/0089455 A1 * | 4/2005 | Marganski | H01L 21/67046 422/168 |
| 2009/0018688 A1 * | 1/2009 | Chandler | B01D 53/346 700/105 |
| 2010/0166630 A1 * | 7/2010 | Gu | B01F 25/4521 422/171 |
| 2013/0139690 A1 * | 6/2013 | Ohuchi | B01D 53/75 96/108 |
| 2021/0302935 A1 * | 9/2021 | Kenichiro | G05B 19/0421 |

FOREIGN PATENT DOCUMENTS

EP         3227017 B1      2/2021

* cited by examiner

*Primary Examiner* — Frank M Lawrence, Jr.
(74) *Attorney, Agent, or Firm* — Francois Pagette; Hoffman Warnick LLC

(57) ABSTRACT

A system to abate an emission stream from a semiconductor manufacturing process is disclosed. The system includes a media canister to abate the emission stream in response to an abatement fault in an abatement apparatus. The media canister includes a reaction chamber configured to receive the emission stream in response to the abatement fault, and a dry media disposed within the reaction chamber to abate the emission stream. The dry media includes at least one reactive and/or absorbent material which catalyzes at least one chemical reaction to remove at least one pollutant from the emission stream and yield exhaust substantially free of the at least one pollutant.

20 Claims, 4 Drawing Sheets

RETROFITTABLE DRY MEDIA ABATEMENT REACTOR

BACKGROUND

The present disclosure relates generally to gas abatement systems and, more particularly, to retrofittable devices and systems for abatement of an emission stream from a semiconductor manufacturing process.

Semiconductor manufacturing processes often yield emissions having hazardous and toxic gas species. An abatement system is typically coupled to a semiconductor manufacturing process to remove, or substantially remove, these gas species from an emission stream output from the manufacturing process. However, these abatement systems may experience abatement faults during operation, decreasing semiconductor manufacturing process efficiency because of operational downtime and/or damaging silicon wafers within the manufacturing process.

SUMMARY

All aspects, examples and features mentioned below can be combined in any technically possible way.

An aspect of the disclosure provides a system including: an abatement apparatus having at least one of a combustion chamber and a water-based chamber configured to abate an emission stream from a semiconductor manufacturing process; a vacuum pump coupled to the abatement apparatus and configured to transmit the emission stream from the semiconductor manufacturing process through the abatement apparatus; and a media canister coupled to the vacuum pump and configured to abate the emission stream in response to an abatement fault in the abatement apparatus, where the media canister includes: a reaction chamber having an inlet configured to receive the emission stream, and a dry media disposed within the reaction chamber and configured to abate the emission stream therein.

Another aspect of the disclosure provides a media canister including: a reaction chamber having an inlet configured to receive an emission stream from a semiconductor manufacturing process; and a dry media disposed within the reaction chamber and configured to abate the emission stream therein, where the media canister is configured to abate the emission stream in response to an abatement fault in an abatement apparatus.

Another aspect of the disclosure provides a method including: transmitting an emission stream from a semiconductor manufacturing process through an abatement apparatus having at least one of a combustion chamber and a water-based chamber configured to abate the emission stream therein; detecting an abatement fault in the abatement apparatus; and transmitting the emission stream to a media canister instead of the abatement apparatus in response to the abatement fault.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following FIGURES, wherein like designations denote like elements, and wherein.

Figure 1:
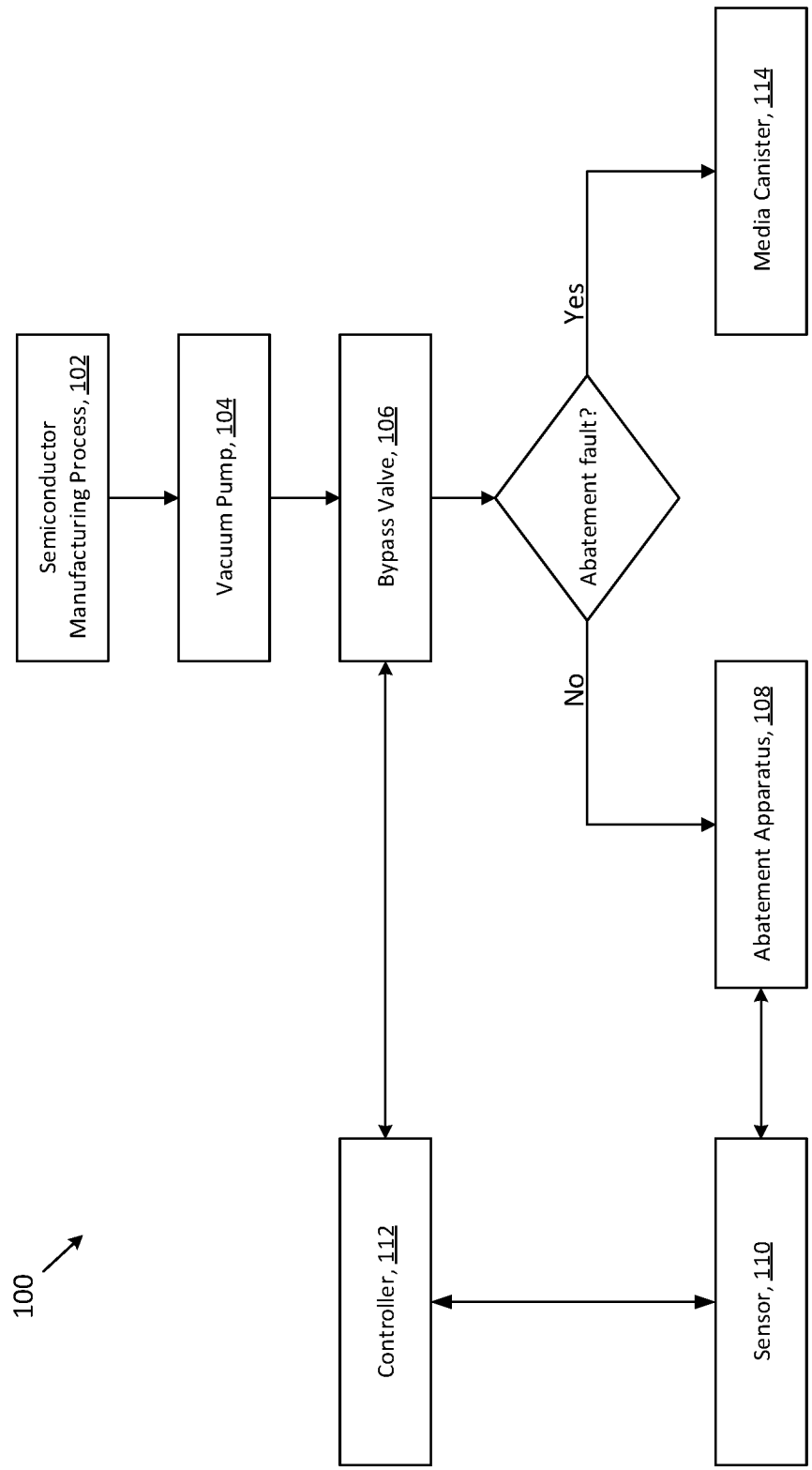
FIG. 1 shows a block diagram of a system for abatement of an emission stream from a semiconductor manufacturing process, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an abatement system and related method to remove harmful and toxic gas species (i.e., abate) an emission stream from a semiconductor manufacturing process. The abatement system may include a first apparatus to implement a first abatement process to abate the emission stream, and a second apparatus to implement a second abatement process in response to an abatement fault in the first apparatus. The first apparatus may include, for example, a gas scrubber and/or plasma scrubber configured to implement combustion and/or wet scrubbing to abate the emission stream. The second apparatus may include, for example, a media canister configured to implement a reactive and/or absorption process to abate the emission stream using a dry media, as discussed herein.

FIG. 1 shows a block diagram of a system 100 to abate an emission stream, according to embodiments of the disclosure. System 100 includes a semiconductor manufacturing process 102, including any step or series of steps that involve fabricating, processing, and/or otherwise modifying a semiconductor material, integrated circuit chip, etc. Semiconductor manufacturing process 102 may yield a hazardous and toxic byproduct, for example an emission stream including a fluorinated gas, a chlorinated gas, a brominated gas, a hydride gas, or a combination of these gases. In some implementations, semiconductor manufacturing process 102 yields an emission stream including substances such as $SiH_4$, $Si_2H_6$, $SiH_2Cl_2$, $Si_2Cl_6$, $GeH_4$, $B_2H_6$, $AsH_4$, $PH_3$, $SiC_8H_{20}O_4$, LTO520, $H_2NSi$, $F_2$, HF, HCl, $Cl_2$, $NF_3$, $NH_3$, $HNO_3$, $TiCl_4$, $BF_3$, $CH_6Si$, $GeF_4$, $BCl_3$, HBr, or a combination of these compounds. System 100 may transmit the emission stream away from semiconductor manufacturing process 102, and through an abatement device configured to remove hazardous and toxic gas species from the emission stream.

System 100 includes a vacuum pump 104 coupled to semiconductor manufacturing process 102. Vacuum pump 104 may transmit emission streams from semiconductor manufacturing process 102 through at least one device, or combination of devices, for abatement. For instance, vacuum pump 104 may transmit the emission stream from semiconductor manufacturing process 102 and through an abatement apparatus 108. Abatement apparatus 108 may include any abatement device, or combination of abatement devices, configured to abate an emission stream therein using at least one process to remove harmful and toxic gas species from the emission stream. For instance, abatement apparatus 108 may include a combustion chamber to abate the emission stream using thermal oxidation, and/or a wet chamber to abate the emission stream using a liquid, e.g., water. However, it should be understood that abatement apparatus 108 may additionally or alternatively implement other components, abatement processes, ordering and/or combination of processes, etc., to abate the emission stream.

During operation, an abatement fault may occur in abatement apparatus 108, decreasing abatement performance and/or possibly rendering abatement apparatus 108 inoperable. System 100 according to the disclosure is operable to transmit the emission stream to another location instead of abatement apparatus 108 in response to detecting the abatement fault. System 100 may include a bypass valve 106 configured to fluidly couple the emission stream to another location in response to the abatement fault. In some implementations, bypass valve 106 includes a manual valve to fluidly couple the emission stream to another location in response to the abatement fault. In other implementations, an external device may transmit electrical signals to actuate bypass valve 106 as discussed herein.

System 100 may include a sensor 110 operatively coupled to abatement apparatus 108 and configured to detect the abatement fault. Sensor 110 may include any sensor, or combination of sensors, configured to detect abatement faults in abatement apparatus 108 due to a measurable variation in operating conditions of system 100. Sensor 110 may include temperature sensors, pressure sensors, flow rate meter sensors, gas sensor, or a combination of these sensors. In some implementations, sensor 110 includes at least one flow meter (e.g., electromagnetic flow meter, turbine flow meter, vortex flow meter, etc.) to measure flow rate of the emission stream. For example, sensor 110 may include a first flow meter which measures an in-flow rate of emission stream into abatement apparatus 108, and a second flow meter which measures an out-flow rate of emission stream out of abatement apparatus 108. In some implementations, sensor 110 includes a gas sensor (e.g., amperometric oxygen sensor, tunable diode laser (TDL) spectrometer, etc.) to measure concentration of a gas species in the emission stream. For instance, sensor 110 may include an amperometric oxygen sensor which measures a concentration of oxygen in the emission stream flowing into and/or out of abatement apparatus 108. In some implementations, sensor 110 includes at least one temperature sensor (e.g., thermometer, thermocouple, etc.) to measure temperature of the emission stream. For example, sensor 110 may include a thermocouple which measures temperature of the emission stream flowing into and/or out of abatement apparatus 108. In some implementations, sensor 110 includes a plurality of sensors that collectively measure a plurality of attributes of the emission stream, system 100, operating conditions, etc. Moreover, sensor 110 may transmit sensor signals indicating detection of the abatement fault in abatement apparatus 108.

System 100 may further include a controller 112 operatively coupled to sensor 110 and bypass valve 106. Controller 112 may receive sensor signals from sensor 110 indicating detection of the abatement fault in abatement apparatus 108, and in turn actuate bypass valve 106 in response to said sensor signals. Controller 112 may include any computing device, or combination of computing devices, capable of receiving and transmitting electrical signals to observe, operate, or otherwise engage system 100 and components thereof. Controller 112 may communicate with external devices over a network, such as a wide area network (WAN) and/or local area network (LAN). In some implementations, an external computing device may communicate with controller 112 to exchange information about system 100, operating conditions, etc. In some implementations, an external computing device may transmit electrical signals to controller 112 that correspond to commands for operating system 100. In some implementations, the external computing device provides a graphical user interface (GUI), which enables a user to observe, operate, or otherwise engage system 100 through the external computing device.

As further shown in FIG. 1, system 100 includes a media canister 114 configured to abate emission stream in response to abatement fault in abatement apparatus 108. Actuation of bypass valve 106 causes transmission of the emission stream through media canister 114, instead of abatement apparatus 108, in response to the abatement fault. As such, operating system 100 may include at least one of the following steps: transmitting the emission stream from semiconductor manufacturing process 102 through abatement apparatus 108; activating sensor 110 to monitor for the abatement fault in abatement apparatus 108; detecting the abatement fault via sensor 110; transmitting sensor signals to controller 112 in response to detecting the abatement fault; and actuating bypass valve 106 via controller 112 in response to sensor signals indicating detecting of the abatement fault; and fluidly coupling vacuum pump 104 and media canister 114 to abate the emission stream therein.

Figure 2:
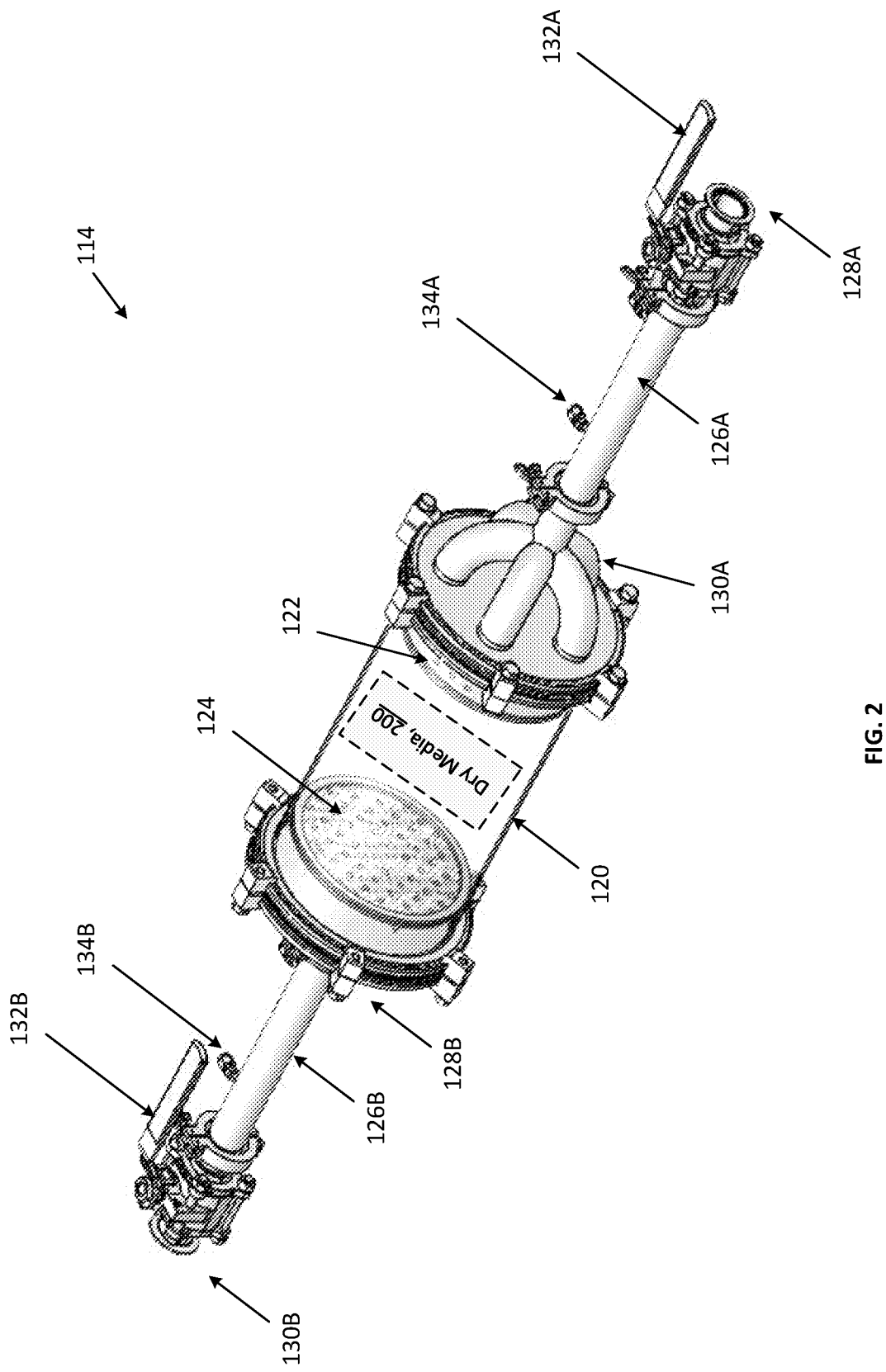
FIG. 2 shows a perspective view of a media canister for abatement of an emission stream from a semiconductor manufacturing process, according to embodiments of the disclosure.

Referring now to FIG. 2, showing an example of media canister 114 configured to abate an emission stream in response to an abatement fault, according to embodiments of the disclosure. Media canister 114 includes a reaction chamber 120 including an inlet 122 at a proximal end and an outlet 124 at a distal end. Reaction chamber 120 is configured to receive the emission stream through inlet 122 in response to the abatement fault (e.g., in abatement apparatus 108). Media canister 114 may include a reactive and/or absorbent dry media (see FIG. 3) disposed within reaction chamber 120, which catalyzes at least one chemical reaction to remove at least one gas species from the emission stream (i.e., abate the emission stream). An exhaust substantially free of the at least one gas species is then released from reaction chamber 120 through outlet 124.

Media canister 114 further includes a first conduit 126A fluidly coupled between reaction chamber 120 and bypass valve 106. First conduit 126A may include a first end 128A configured to couple to bypass valve 106, and a second end 130A configured to couple to inlet 122 opposite first end 128A. First conduit 126A therefore may receive the emission stream through first end 128A and transmit the emission stream along a length thereof. The emission stream then may pass through second end 130A into reaction chamber 120. In some implementations, inlet 122 includes a mesh screen to retain dry media within reaction chamber 120 and prevent blockages in first conduit 126A. Media canister 114 may include a valve 132A disposed along and operatively coupled to first conduit 126A between first end 128A and second end 130A. Valve 132A may adjust flow rate of the emission stream through first conduit 126A. Media canister 114 may include a gas port 134A disposed along first conduit 126A between valve 132A and second end 130A, which may be operable to indicate whether gas is flowing through first conduit 126A. Gas port 134 may allow an operator of system 100 to determine if valve 132A is in an open position or closed position, or in any number of partially open positions. Valve 132A and/or gas port 134A may be operable to couple and/or decouple media canister 114 with bypass valve 106. Moreover, gas port 134A may be useful to support efficiency testing of dry media for destruction and removal efficiency of harmful and toxic gas species in released emissions.

Media canister 114 may further include a second conduit 126B coupled to reaction chamber 120. Second conduit 126B may include a first end 128B configured to couple to outlet 124 of reaction chamber 120, and a second end 130B opposite first end 128B. In some implementations, outlet 124 includes a mesh screen to retain dry media within reaction chamber 120 and prevent blockages in second conduit 126B. In some implementations, second end 130B is coupled to an exhaust chamber (not shown) configured to receive the emission stream therein after abatement. Second conduit 126B therefore may receive the emission stream through first end 128B, transmit the emission stream along a length thereof, and through second end 130B into the exhaust chamber. Media canister 114 may include a valve 132B disposed along second conduit 126B between first end 128B and second end 130B, which may adjust flow rate of the emission stream through second conduit 126B. Media canister 114 may include a gas port 134B disposed along second conduit 126B between valve 132B and second end 130B, which may be useful to determine whether gas is flowing through second conduit 126B, and therefore to determine if valve 132B is in any open position or closed position. Valve 132B and/or gas port 134B may be useful to couple and/or decouple media canister 114 with bypass valve 106. Moreover, gas port 134B may be useful to support efficiency testing of dry media for destruction and removal efficiency of harmful and toxic gas species in released emissions.

In the present embodiment shown in FIGS. 1 and 2, media canister 114 is coupled to semiconductor manufacturing process 102 for abatement of emission stream in response to detecting an abatement fault, as discussed herein. In some implementations, system 100 (FIG. 1) may include a plurality of media canisters 114, which are arranged in parallel such that each is configured to abate the emission stream from semiconductor manufacturing process 102. In other implementations, media canister 114 is coupled to different manufacturing process(es) for abating an emission stream in response to an abatement fault. For instance, media canister 114 may fluidly couple to a chemical manufacturing process and be configured to abate emissions stream from said chemical manufacturing process in response to an abatement fault.

Figure 3:
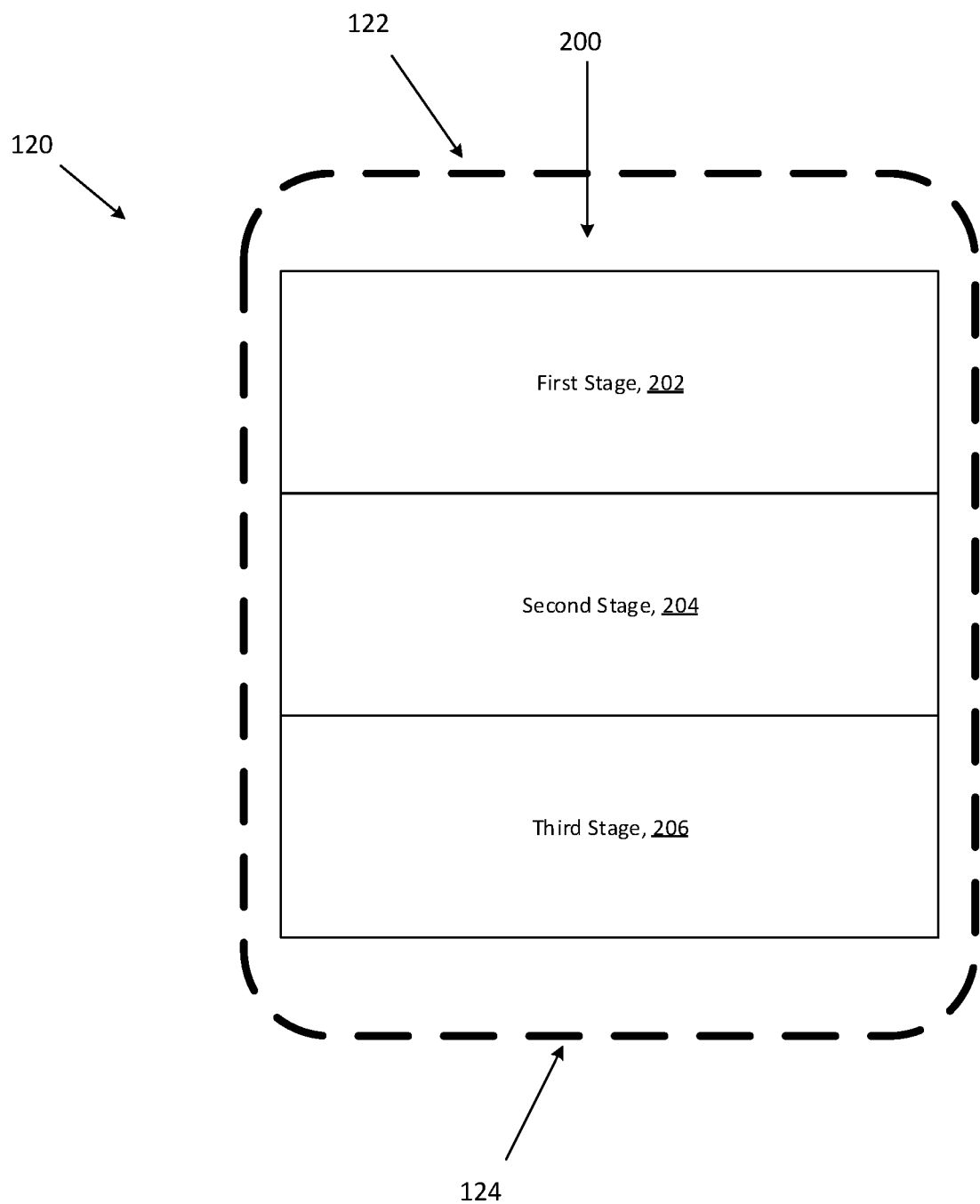
FIG. 3 shows a simplified schematic view of a media canister according to embodiments of the disclosure.

Referring now to FIG. 3, illustrating a cross-sectional view of media canister 114 having a dry media 200 disposed therein, according to embodiments of the disclosure. Dry media 200 may include any now known or later developed material, or combination of materials, capable of catalyzing one or more chemical reactions to abate an emission stream within reaction chamber 120.

In some implementations, dry media 200 includes a reactive and/or absorbent media, or combination of reactive and/or absorbent medias, capable of catalyzing one or more chemical reactions to abate the emission stream. In some implementations, dry media 200 includes a granulate such as, but not limited to, a copper-based granulate, an aluminum-based granulate, a zeolite granulate, a calcium-based granulate, a magnesium-based granulate, a carbon-based granulate, a gallium-based granulate, a titanium based granulate, or a combination of these granulates. In some implementations, dry media 200 includes an acid removal media, base removal media, volatile organic compound (VOC) removal media, greenhouse gas (GHG) removal media, a hydride removal media, an activated carbon media, or a combination of these materials. The term "acid removal media" as used herein refers to a compound, or combination of compounds, capable of neutralizing acidic gas in an emission stream, such as a calcium-based compound, e.g., calcium carbonate ($CaCO_3$), etc. The term "base removal media" as used herein refers to a compound, or combination of compounds, capable of neutralizing basic gas in an emission stream, such as a mineral-based compound, e.g. zeolite, etc. The term "greenhouse gas removal media" as used herein refers to a compound, or combination of compounds, capable of neutralizing greenhouse gas in an emission stream, such as sodium and calcium-based compounds compounds, e.g. soda lime, etc. The term "hydride removal media" as used herein refers to a compound, or combination of compounds, capable of destroying hydride gas in an emission stream, such as a copper-based compound, e.g., metal oxide media, copper oxide (CuO), copper carbonate ($CuCO_3$), zinc oxide (ZnO), aluminum oxide ($Al_2O_3$), etc. The term "activated carbon media" as used herein refers to a carbon-based compound, or combination of carbon-based compounds, capable of removing pollutants from an emission stream via adsorption.

Dry media 200 moreover may include a plurality of media stages disposed within reaction chamber 120 between inlet 122 and outlet 124 thereof. Each media stage may include at least one reactive or absorbent material to catalyze at least one chemical reaction to abate the emission stream flowing through reaction chamber 120. For instance, as shown in the embodiment of FIG. 3, dry media 200 may include a plurality of media stages disposed within reaction chamber 120. The plurality of media stages may include a first stage 202 of acid removal media, a second stage 204 of hydride removal media, and a third stage 206 of GHG removal media. In a specific implementation, first stage 202 includes at least 0.5 liters of acid removal media, second stage 204 includes at least three liters of hydride removal media, and third stage 206 includes at least 0.25 liters of activated carbon media.

In the present embodiment, first stage 202 and third stage 206 each include calcium carbonate ($CaCO_3$), and second stage 204 includes copper oxide (CuO). However, dry media 200 may additionally or alternatively include other abatement media, ratio of media, and/or arrangement of media, as contemplated within the scope of the present disclosure. Dry media 200 therefore may abate an emission stream through a series of chemical reactions.

Chemical reactions in first stage 202 may include:

$$2HF + CaCO_3 \xrightarrow{yields} CaF_2 + CO_2 + H_2O \quad (1)$$

$$2HCl + CaCO_3 \xrightarrow{yields} CaCl_2 + CO_2 + H_2O \quad (2)$$

Chemical reactions in second stage 204 may include:

$$SiH_4 + 4CuO \xrightarrow{yields} SiO_2 + 2H_2O + 4Cu \quad (3)$$

$$Si_2H_6 + 7CuO \xrightarrow{yields} 2SiO_2 + 3H_2O + 7Cu \quad (4)$$

$$SiH_4 + 4CuSO_4 \xrightarrow{yields} Cu_4Si + 2H_2SO_4 + 2SO_4 \quad (5)$$

Third stage 206 may include absorption into porous structure of activated carbon. Chemical reactions in third stage 206 may include:

(6)

The preceding paragraphs detail several non-limiting examples of chemical reactions that may occur within reaction chamber 120 to abate the emission stream. However, alternative and/or additional chemical reactions may occur based on composition of dry media 200, abatement technique, abatement requirements, etc.

Figure 4:
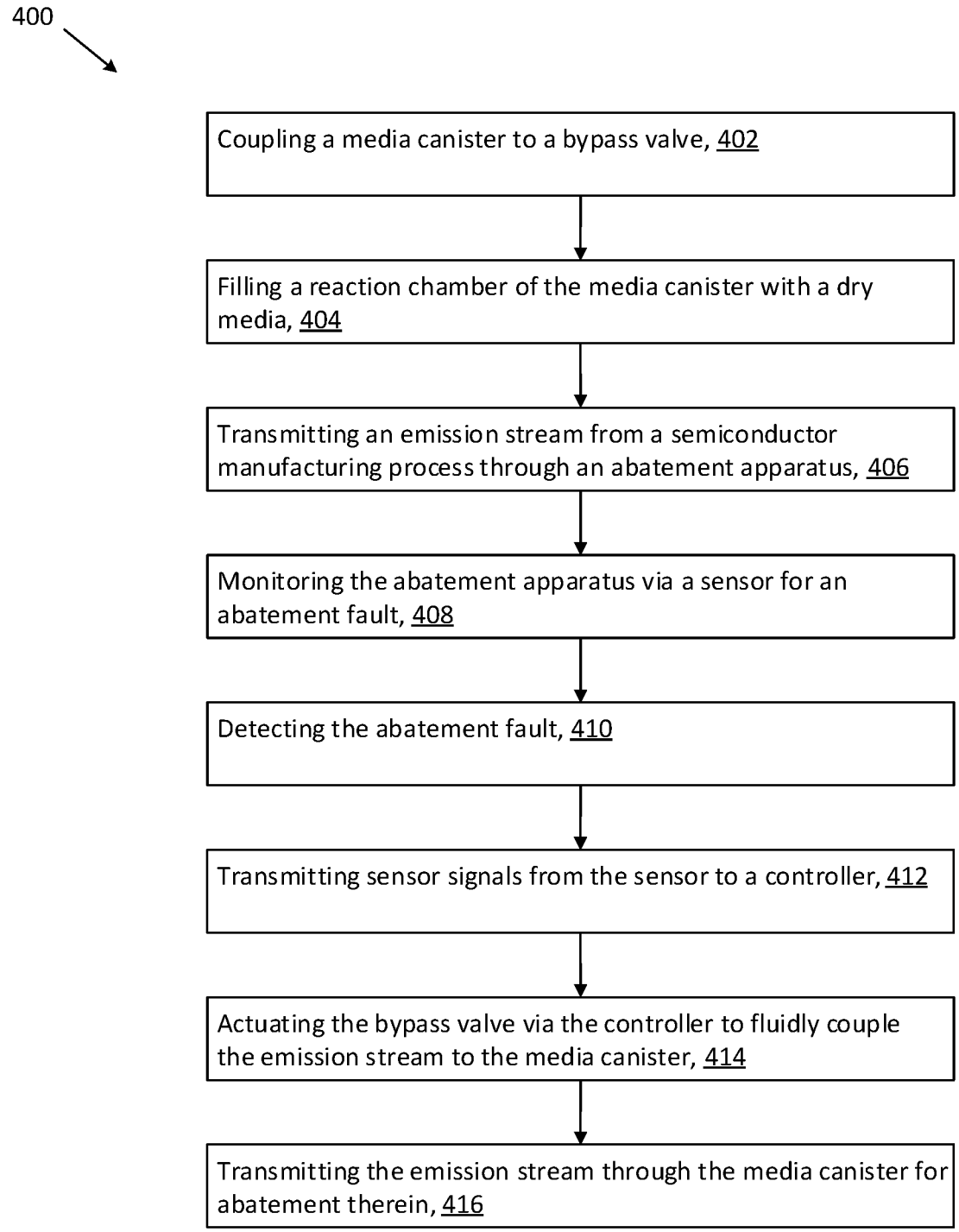
FIG. 4 shows a method according to embodiments of the disclosure.

Referring now to FIG. 4, showing a method 400 to abate an emission stream according to embodiments of the disclosure. Method 400 may include, but is not limited to, a step or series of steps to abate the emission stream using system 100 as shown in FIG. 4 and discussed herein.

At step 402, method 400 may include coupling a media canister to a bypass valve. At step 404, method 400 may include filling a reaction chamber of media canister with dry media. At step 406, transmitting an emission stream from a semiconductor manufacturing process through an abatement apparatus. At step 408, monitoring the abatement apparatus via a sensor for an abatement fault. At step 410, detecting the abatement fault via the sensor. At step 412, transmitting sensor signals from the sensor to a controller. At step 414, actuating the bypass valve via the controller to fluidly couple the emissions stream to the media canister. And at step 416, transmitting the emission stream through the media canister for abatement therein. Method 400 therefore may include, with reference to FIGS. 1-3, the following series of steps, including: at step 402, coupling media canister 114 to bypass valve 106 (FIG. 1); at step 404, filling reaction chamber 120 with dry media 200 (FIGS. 2 and 3); at step 406, transmitting the emission stream from semiconductor manufacturing process 102 through abatement apparatus 108 for abatement therein; at step 408, monitoring abatement apparatus 108 via sensor 110 for the abatement fault; at step 410, detecting the abatement fault via sensor 110; at step 412, transmitting sensor signals from sensor 110 to a controller; at step 414, actuating bypass valve 106 via controller 112 to fluidly couple the emission stream to the media canister; and at step 416, transmitting the emission stream through media canister 114 for abatement therein. However, method 400 may additionally or alternatively include other steps, combinations of steps, and/or arrangement thereof.

Embodiments of the disclosure provide various technical and commercial advantages, examples of which are discussed herein. For instance, embodiments of the disclosure may be useful for abating exhaust of leak checking devices in hazardous environments, in an emergency situation to discharge hazardous gas, and/or in the event of a power outage or other facilities outage. Embodiments of the disclosure moreover are retrofittable and do not require additional floor space or additional utility connections for installation.

For purposes of this disclosure, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A system comprising:
   an abatement apparatus having at least one of a combustion chamber and a water-based chamber configured to abate an emission stream from a semiconductor manufacturing process;
   a vacuum pump coupled to the abatement apparatus and configured to transmit the emission stream from the semiconductor manufacturing process through the abatement apparatus; and
   a media canister coupled to the vacuum pump and configured to abate the emission stream in response to an abatement fault in the abatement apparatus, wherein the media canister comprises:
   a reaction chamber having an inlet configured to receive the emission stream, and
   a dry media disposed within the reaction chamber and configured to abate the emission stream therein.

2. The system of claim 1, further comprising:
   a sensor coupled to the abatement apparatus and configured to detect the abatement fault; and
   a bypass valve fluidly coupled between the vacuum pump and the media canister, wherein the bypass valve is configured to fluidly couple the emission stream to the media canister in response to the sensor detecting the abatement fault.

3. The system of claim 2, further comprising a controller operatively coupled to the sensor and the bypass valve, wherein the controller is configured to actuate the bypass valve in response to sensor signals transmitted from the sensor in response to detecting the abatement fault.

4. The system of claim 2, wherein the media canister comprises:
   a first conduit fluidly coupled between the bypass valve and the inlet;
   a second conduit fluidly coupled to an outlet of the reaction chamber; and
   a valve disposed along at least one of the first conduit and the second conduit,
   wherein the valve is configured to adjust the emission stream flow rate through at least one of the first conduit and the second conduit.

5. The system of claim 4, wherein the first conduit comprises:
   a first end coupled to the bypass valve;
   a second end having a manifold coupled to the inlet; and
   a gas port disposed along the first conduit between the first end and the second end, wherein the valve is disposed along the first conduit between the inlet and the gas port.

6. The system of claim 1, wherein the reaction chamber comprises a sealable hatch configured to receive the dry media therein.

7. The system of claim 1, wherein the dry media comprises at least one of acid removal media, base removal media, volatile organic compounds (VOC) removal media, greenhouse gas (GHG) removal media, combustible gas removal media, hydride removal media, activated carbon media, or a combination of these removal medias.

8. The system of claim 1, wherein the dry media comprises a plurality of stages that each include at least one media which catalyzes at least one chemical reaction to remove at least one pollutant from the emission stream.

9. The system of claim 8, wherein the plurality of stages of the dry media comprises:
   a first stage of an acid removal media;
   a second stage of a hydride removal media; and
   a third stage of an activated carbon media.

10. The system of claim 9, wherein the acid removal media comprises calcium carbonate ($CaCO_3$), and wherein the hydride removal media comprises a metal oxide.

11. A media canister comprising:
   a reaction chamber having an inlet configured to receive an emission stream from a semiconductor manufacturing process;
   a dry media disposed within the reaction chamber and configured to abate the emission stream therein, wherein the media canister is configured to abate the emission stream in response to an abatement fault in an abatement apparatus;
   a first conduit including a first end coupled to a bypass valve, and a second end having a manifold coupled to the inlet of the reaction chamber, wherein the bypass valve is configured to fluidly couple the emission stream to the media canister in response to the abatement fault;

a second conduit coupled to an outlet of the reaction chamber; and a valve disposed along at least one of the first conduit and the second conduit, wherein the valve is configured to adjust the emission stream flow rate through at least one of the first conduit and the second conduit.

12. The media canister of claim 11, wherein the first conduit comprises a gas port disposed along the first conduit between the first end and the second end, wherein the valve is disposed along the first conduit between the inlet and the gas port.

13. The media canister of claim 11, wherein the reaction chamber comprises a sealable hatch configured to receive the dry media therein.

14. The media canister of claim 11, wherein the dry media comprises at least one of acid removal media, base removal media, volatile organic compounds (VOC) removal media, greenhouse gas (GHG) removal media, combustible gas removal media, hydride removal media, activated carbon media, or a combination of these removal medias.

15. The media canister of claim 11, wherein the dry media comprises a plurality of stages that each include at least one media which catalyzes at least one chemical reaction to remove at least one pollutant from the emission stream.

16. The media canister of claim 15, wherein the plurality of stages of the dry media comprises:

a first stage of an acid removal media;

a second stage of a hydride removal media; and a third stage of an activated carbon media.

17. The media canister of claim 16, wherein the acid removal media comprises calcium carbonate ($CaCO_3$).

18. The media canister of claim 16, wherein the hydride removal media comprises a metal oxide.

19. The media canister of claim 11, wherein the dry media comprises at least one granulate.

20. The media canister of claim 19, wherein the dry media comprises copper-based granulate, aluminum-based granulate, zeolite-based granulate, calcium-based granulate, magnesium-based granulate, carbon-based granulate, gallium-based granulate, titanium-based granulate, or a combination of these granulates.

\* \* \* \* \*